United States Patent
Penzo et al.

(10) Patent No.: US 10,536,070 B1
(45) Date of Patent: Jan. 14, 2020

(54) DRIVER FOR SWITCHING GALLIUM NITRIDE (GaN) DEVICES (71) Applicant: Infineon Technologies AG, Neubiberg (DE)

(72) Inventors: Roberto Penzo, Vigonza (IT); Maurizio Galvano, Padova (IT)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 16/052,479

(22) Filed: Aug. 1, 2018

(51) Int. Cl.
- *H02M 3/158* (2006.01)
- *H02M 1/08* (2006.01)
- *H01L 29/20* (2006.01)
- *H03K 17/687* (2006.01)
- *H01L 29/778* (2006.01)

(52) U.S. Cl.
CPC .......... *H02M 1/08* (2013.01); *H01L 29/2003* (2013.01); *H01L 29/778* (2013.01); *H02M 3/158* (2013.01); *H03K 17/687* (2013.01); *H03K 2217/0063* (2013.01); *H03K 2217/0072* (2013.01)

(58) Field of Classification Search
None
See application file for complete search history.

(56) References Cited

U.S. PATENT DOCUMENTS

| 7,046,040 | B2 | 5/2006 | Guedon | |
|---|---|---|---|---|
| 8,558,586 | B1 * | 10/2013 | Martin | G11C 7/1057 327/108 |
| 9,685,869 | B1 | 6/2017 | Kinzer et al. | |
| 2005/0102128 | A1 * | 5/2005 | Wilhelm | H03K 17/063 703/23 |
| 2005/0162228 | A1 * | 7/2005 | Putzeys | H03F 1/3211 330/251 |
| 2006/0103428 | A1 * | 5/2006 | Shimada | H03K 17/063 326/83 |
| 2007/0236283 | A1 | 10/2007 | Locatelli et al. | |
| 2008/0258808 | A1 | 10/2008 | Locatelli et al. | |
| 2010/0123511 | A1 * | 5/2010 | Strzalkowski | H03K 17/6871 327/530 |
| 2014/0021932 | A1 * | 1/2014 | Ejury | G05F 3/02 323/311 |
| 2016/0079785 | A1 * | 3/2016 | Kinzer | H02J 7/0052 320/107 |
| 2016/0087623 | A1 * | 3/2016 | Yamaguchi | H03K 17/163 327/109 |
| 2016/0105173 | A1 * | 4/2016 | De Rooij | H03K 17/6871 327/109 |

(Continued)

FOREIGN PATENT DOCUMENTS

| FR | 2858493 A1 | 2/2005 |
|---|---|---|
| JP | 2013115954 A | 6/2013 |

(Continued)

*Primary Examiner* — Jeffrey A Gblende (74) *Attorney, Agent, or Firm* — Shumaker & Sieffert, P.A.

(57) ABSTRACT

A device for switching Gallium Nitride (GaN) devices includes a high side driver, low side driver, and high side charge circuitry. The high side driver is adapted to control a high side GaN device using a high side supply. The low side driver is adapted to control a low side GaN device using a low side supply. The high side charge circuitry is adapted to charge the high side supply with the low side supply when the low side driver activates the low side GaN device.

18 Claims, 9 Drawing Sheets (56) References Cited

U.S. PATENT DOCUMENTS

2016/0134279 A1* 5/2016 Sicard .................. H03K 17/687
327/109
2017/0163258 A1 6/2017 Kinzer et al.

FOREIGN PATENT DOCUMENTS

| WO | 9427370 A1 | 11/1994 |
| WO | 9724794 A2 | 7/1997 |
| WO | 2017100661 A1 | 6/2017 |
| WO | 2017190652 A1 | 11/2017 |

* cited by examiner

DRIVER FOR SWITCHING GALLIUM NITRIDE (GAN) DEVICES

TECHNICAL FIELD

This disclosure relates to circuitry for driving Gallium Nitride (GaN) devices, particularly, GaN devices in half bridge switching applications.

BACKGROUND

Gallium Nitride (GaN) devices have desirable characteristics, which can make them more suitable compared to metal-oxide-semiconductor field-effect transistors (MOSFETs) in half bridge switching applications, especially when high frequencies and high efficiencies are needed. For example GaN devices can have a faster switching speed and/or a smaller package compared to MOSFETs. Moreover, GaN devices can omit a parasitic body diode, which can result in no reverse recovery losses. Further, GaN devices are capable of reverse conduction. As such, GaN devices may omit an external anti-parallel diode.

SUMMARY

In general, this disclosure is directed to a driver for Gallium Nitride (GaN) devices with a high side supply that is charged with a low side supply. For example, the driver may be adapted to charge the high side supply with the low side supply when the low side driver activates the low side GaN device. In this way, the driver may charge the high side supply to a desired floating voltage without necessarily relying on additional components for post-regulation of the voltage output by the high side supply or clamping the voltage output by the high side supply.

In an example, a device for switching GaN devices includes a high side driver adapted to control a high side GaN device using a high side supply, a low side driver adapted to control a low side GaN device using a low side supply, and high side charge circuitry adapted to charge the high side supply with the low side supply when the low side driver activates the low side GaN device.

In another example, a method for driving GaN devices includes controlling a high side GaN device using a high side supply, controlling a low side GaN device using a low side supply, and charging the high side supply with the low side supply when the low side driver activates the low side GaN device.

In another example, a system for controlling a power converter includes a high side GaN device, a low side GaN device, a high side driver adapted to control the high side GaN device using a high side supply, a low side driver adapted to control the low side GaN device using a low side supply, and high side charge circuitry adapted to charge the high side supply with the low side supply when the low side driver activates the low side GaN device.

Details of these and other examples are set forth in the accompanying drawings and the description below. Other features, objects, and advantages will be apparent from the description and drawings, and from the claims.

DETAILED DESCRIPTION

A difficulty when driving Gallium Nitride (GaN) Enhancement High-electron-mobility transistor (e-HEMTs) is the narrow gate voltage range (−4V/+6V typical) of GaN e-HEMTs compared to metal-oxide-semiconductor field-effect transistors (MOSFETs). Another characteristic of a GaN e-HEMT is that reverse current flow with the Voltage Gate to Source "$V_{GS}$" less than zero (e.g., $V_{GS} \leq 0$ V) is "diode-like" and establishes when the gate voltage with respect to the drain exceeds a voltage threshold "$V_{th}$" of the GaN e-HEMT. An example of the Voltage Source to Drain "$V_{SD}$" follows.

$$V_{SD} = V_{SG} V_{GD} = -V_{GS} + V_{th} I^* R_{rev\_ON} \qquad \text{(equation 1)}$$

where "$V_{SG}$" is the Voltage Source to Gate, "$V_{GD}$" is the Voltage Gate to Drain, "I" is the current at the GaN e-HEMT, and "Rrev_ON" is the resistance of the GaN e-HEMT.

Given that the voltage threshold "$V_{th}$" is in the range 1.5 V-2 V, the Voltage Source to Drain "$V_{SD}$" is typically higher than the voltage threshold of a silicon power MOSFET. For high voltage and high dV/dt kW applications, GaN e-HEMTs may be turned off with a negative Voltage Gate to Source "$V_{GS}$", further increasing the Voltage Source to Drain "$V_{SD}$" needed by the GaN e-HEMT device to operate in reverse.

Such GaN e-HEMT characteristics may be undesirable in applications in which low side free-wheeling is used, such as, but not limited to, half bridge switching applications using a high side GaN e-HEMT device and a low side GaN e-HEMT device. For example, when the high side GaN e-HEMT "$T_H$" is turned off, a positive inductor current is forced to flow on the low side, which goes into reverse conduction, which results in the switching node voltage being equal to Voltage Drain to Source "$V_{DS}$" voltage of the low side GaN e-HEMT "$T_L$" during dead switching. In bootstrap capacitor based high side drivers, the negative voltage at the switching node (e.g. the high side driver floating ground) may overcharge the bootstrap capacitor above the maximum rating of GaN Voltage Source to Gate "$V_{GS}$," which may result in damage to the high side GaN e-HEMT device.

In some systems, additional post-regulation circuitry is used to regulate a bootstrap voltage to avoid damaging the GaN e-HEMT while preserving driving capabilities. In other systems, additional external (or internal) Zener diodes (plus a resistor) is used to clamp bootstrap voltage to avoid damaging the GaN e-HEMT while preserving driving capabilities. In yet further systems, an additional series switch with its body diode back-to-back connected to the bootstrap diode is used to cut out the recharge path when the low side GaN e-HEMT device is OFF (e.g., operating in an open state).

In accordance with one or more techniques described herein, a driver may include high side charge circuitry adapted to charge the high side supply with the low side supply when the low side driver activates the low side GaN device. For example, a driver may be adapted to connect a bootstrap diode to the low side GaN e-HEMT gate re-using the already existing gate pull-up pMOS as a blocking switch, optimizing the synchronization between low side GaN e-HEMT turn-on and bootstrap capacitor recharge path activation, thus protecting the application against bootstrap overcharge with no extra pin and silicon cost. Some advantages of including such high side charge circuitry may include, but are not limited to, for example, an optimal timing between low side turn-on and bootstrap capacitor recharge path activation, no additional external or internal components, and no additional driver pins.

Figure 1:
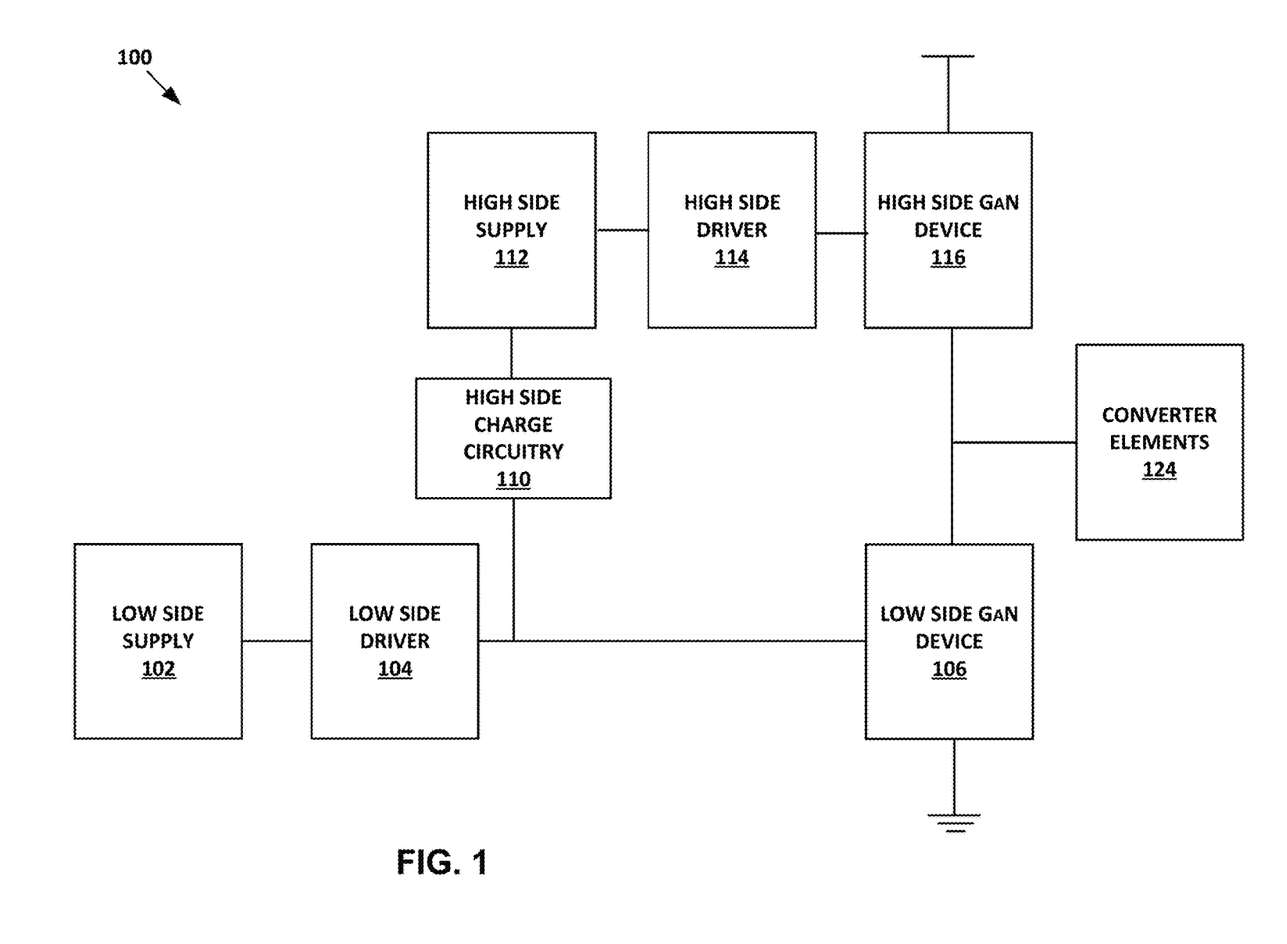
FIG. 1 is a block diagram illustrating a driver for Gallium Nitride (GaN) devices with a high side supply that is charged with a low side supply in accordance with one or more techniques of this disclosure.

FIG. 1 is a block diagram illustrating a driver for GaN devices with a high side supply that is charged with a low side supply in accordance with one or more techniques of this disclosure. FIG. 1 shows system 100 which includes low side supply 102, low side driver 104, low side GaN device 106, high side charge circuitry 110, high side supply 112, high side driver 114, high side GaN device 116, and converter elements 124. System 100 may include additional components than those shown. In some examples, system 100 may be implemented as a single or multiple integrated circuit (IC) packages.

Low side supply 102 may be configured to provide electrical power to one or more other components of system 100. For instance, low side supply 102 may be configured to supply a charge at a gate of low side GaN device 106. In some examples, low side supply 102 may be an output of a power converter, power inverter, regulator, or other power conversion circuitry. For instance, low side supply 102 may be an output of a direct current (DC) to DC power converter, an alternating current (AC) to DC power converter, a DC to AC power inverter, a linear regulator, or other power conversion circuitry.

Low side driver 104 may be adapted to control low side GaN device 106 using low side supply 102. For example, low side driver 104 may include switching elements that couple a gate of low side GaN device 106 to a positive terminal of low side supply 102 or a negative terminal (e.g., ground) of low side supply 102. Examples of switching elements may include, but are not limited to, junction field-effect transistor (JFET), metal-oxide-semiconductor Field-Effect-Transistor (MOSFET), dual-gate MOSFET, insulated-gate bipolar transistor (IGBT), any other type of FET, or any combination of the switching elements. Examples of MOSFETS may include, but are not limited to, p-channel MOSFET (pMOS), n-channel MOSFET (nMOS), double diffused MOSFET (DMOS), or any other type of MOSFET, or any combination of the same. In some examples, a switching element may comprise a high-electron mobility transistor, a GaN based transistor, or another switching element. Other materials may also be used to realize a switching element.

Low side driver 104 may include low side driving circuitry adapted to selectively drive switching elements to couple a gate of low side GaN device 106 to a positive terminal of low side supply 102 or a negative terminal (e.g., ground) of low side supply 102. Low side driving circuitry may comprise a modulation (e.g., pulse-width modulation) controller. For example, low side driving circuitry may output, to the switching elements, a high signal (e.g., logical '1') during a first portion of a pulse-width modulation cycle to cause switching elements to couple a gate of low side GaN device 106 to a positive terminal of low side supply 102. In the example, low side driving circuitry may output, to switching elements, a low signal (e.g., logical '0') during a second portion of a pulse-width modulation cycle to cause switching elements to couple a gate of low side GaN device 106 to a negative terminal of low side supply 102. In some examples, low side driving circuitry may output, to switching elements, one or more dead-time signal during a third portion of a pulse-width modulation cycle to cause switching elements to decouple a gate of low side GaN device 106 from the low side supply 102.

Low side driving circuitry may comprise any suitable arrangement of hardware, software, firmware, or any combination thereof. Low side driving circuitry may include any one or more microprocessors, digital signal processors (DSPs), application specific integrated circuits (ASICs), field programmable gate arrays (FPGAs), or any other equivalent integrated or discrete logic circuitry, as well as any combinations of such components. When low side driving circuitry includes software or firmware, low side driving circuitry may further include any necessary hardware for storing and executing the software or firmware, such as one or more memories and one or more processors or processing units. In general, a processing unit may include one or more microprocessors, DSPs, ASICs, FPGAs, or any other equivalent integrated or discrete logic circuitry, as well as any combinations of such components.

High side supply 112 may be adapted to provide electrical power to one or more other components of system 100. For instance, high side supply 112 may be adapted to supply a charge at a gate of high side GaN device 116. In some examples, high side supply 112 may be floating. For example, high side supply 112 may have a negative terminal that has a voltage different from a ground of system 100 (e.g., a negative terminal of low side supply 102). In some examples, high side supply 112 includes a capacitor. A capacitor may include, an electrical component adapted to store electrical energy in an electric field. Examples of an electrical component configured to store electrical energy in an electric field may include, but are not limited to, ceramic capacitors, film capacitors, electrolytic capacitors (e.g., aluminum, tantalum, niobium, or the like), super capacitors (e.g., double layer, pseudocapacitors, hybrid capacitors), mica capacitors, or another capacitor. Although examples of this disclosure may refer to a capacitor as a single capacitor, in some examples, a capacitor may be an array of capacitive elements. For instance, high side supply 112 may include a capacitor formed of an array of capacitive elements coupled in parallel and/or series. In some instances, each capacitive element may be a discrete component, while in other instances, each one of the capacitive elements may be contained within a single package (e.g., capacitor array).

High side driver 114 may include high side driving circuitry adapted to selectively drive switching elements to couple a gate of high side GaN device 116 to a positive terminal of high side supply 112 or a negative terminal of high side supply 112. High side driving circuitry may comprise a modulation (e.g., pulse-width modulation) controller. For example, high side driving circuitry may output, to the switching elements, a high signal (e.g., logical '1') during a first portion of a pulse-width modulation cycle to cause switching elements to couple a gate of high side GaN device 116 to a positive terminal of high side supply 112. In the example, high side driving circuitry may output, to switching elements, a low signal (e.g., logical '0') during a second portion of a pulse-width modulation cycle to cause switching elements to couple a gate of high side GaN device 116 to a negative terminal of high side supply 112. In some examples, high side driving circuitry may output, to switching elements, one or more dead-time signal during a third portion of a pulse-width modulation cycle to cause switching elements to decouple a gate of high side GaN device 116 from the high side supply 112.

High side driving circuitry may comprise any suitable arrangement of hardware, software, firmware, or any combination thereof. High side driving circuitry may include any one or more microprocessors, digital signal processors (DSPs), application specific integrated circuits (ASICs), field programmable gate arrays (FPGAs), or any other equivalent integrated or discrete logic circuitry, as well as any combinations of such components. When high side driving circuitry includes software or firmware, low side driving circuitry may further include any necessary hardware for storing and executing the software or firmware, such as one or more memories and one or more processors or processing units.

High side charge circuitry 110 may be adapted to charge high side supply 112 with low side supply 102 when low side driver 104 activates low side GaN device 106. In some examples, high side charge circuitry 110 may be adapted to prevent current from flowing from high side supply 112 to low side driver 104 and to permit current to flow from low side driver 104 to high side supply 112. For example, high side charge circuitry 110 may be configured to generate a channel that electronically couples low side supply 102 to high side supply 112 when low side driver 104 activates low side GaN device 106. For instance, high side charge circuitry may be coupled to an output of low side driver 104 and/or a gate of low side GaN device 106. In some examples, high side charge circuitry 110 may include a diode that prevents current from flowing from high side supply 112 to low side supply 102 and permits current to flow from low side supply 102 to high side supply 112. In some examples, high side charge circuitry 110 may include a switch that is selectively activated to prevent current from flowing from high side supply 112 to low side supply 102 and to permit current to flow from low side supply 102 to high side supply 112.

Converter elements 124 may be adapted to provide a target voltage, current, or power at a load. Converter elements 124 may include, for example, one or more of a capacitor, an inductor, a resistor, a transformer, a sensor, or another converter element. In some examples, a load is coupled to converter elements 124 that is configured to receive the target voltage, current, or power output by converter elements 124.

Rather than relying on specialized circuitry for regulating a voltage at high side supply 112, high side charge circuitry 110 is adapted to charge high side supply 112 with low side supply 102 when low side driver 104 activates low side GaN device 106. For example, when low side driver 104 couples a gate of low side GaN device 106 to a positive terminal of low side driver 104, high side charge circuitry 110 may couple a positive terminal of high side supply 112 to the positive terminal of low side driver 104. In this example, low side GaN device 106 forms a channel that couples the negative terminal of low side supply 102 and high side supply 112 such that low side supply 102 charges high side supply 112. For instance, low side GaN device 106 forms a channel that couples the negative terminal of low side supply 102 and high side supply 112 such that high side supply 112 charges a capacitor of high side supply 112.

Figure 2:
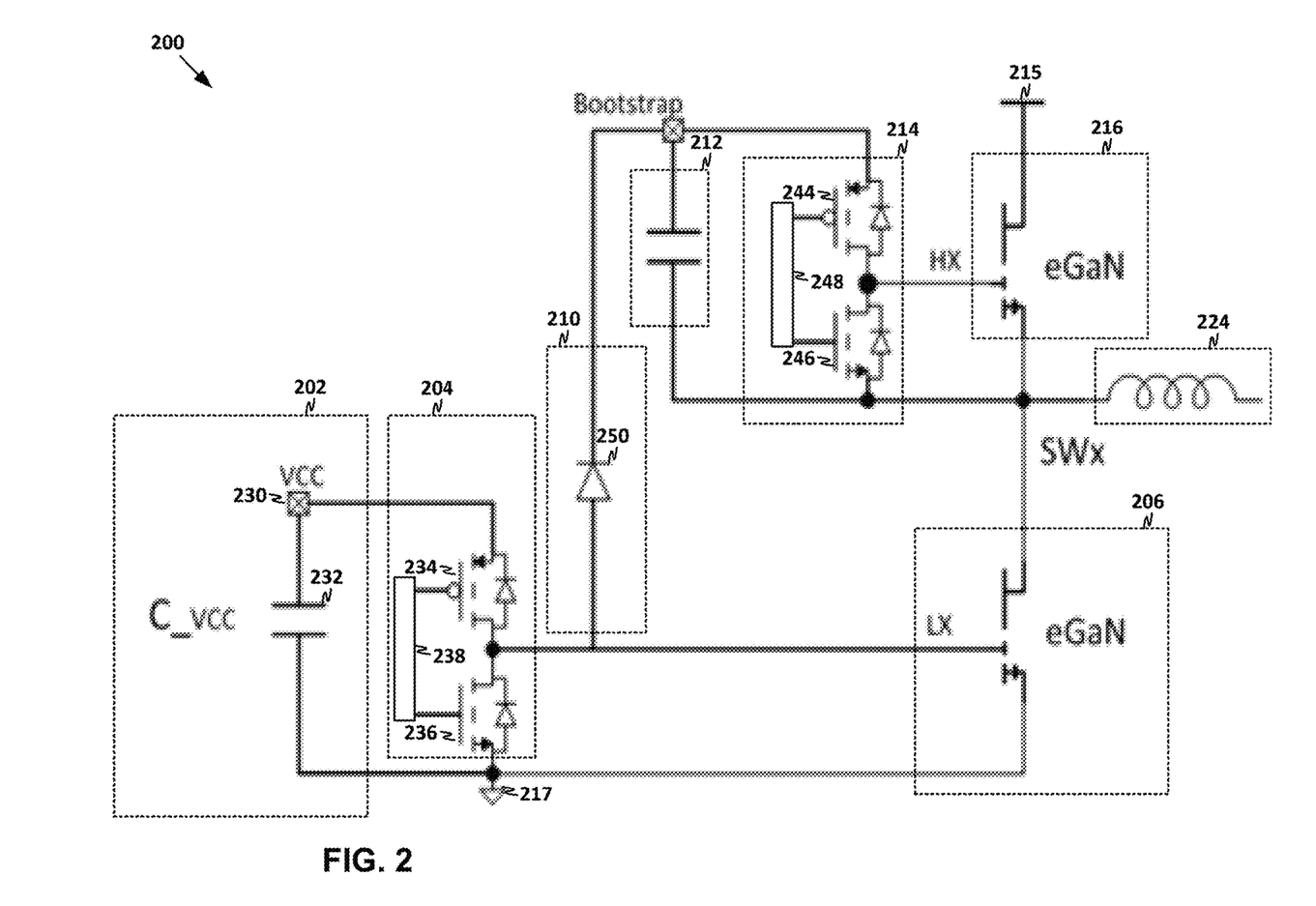
FIG. 2 is a circuit diagram illustrating a first example of the driver of FIG. 1 in accordance with one or more techniques of this disclosure.

FIG. 2 is a circuit diagram illustrating a first example of the driver of FIG. 1 in accordance with one or more techniques of this disclosure. As shown, system 200 includes low side supply 202, low side driver 204, low side GaN device 206, high side charge circuitry 210, high side supply 212, high side driver 214, high side GaN device 216, and converter elements 224. System 200 may include additional components than those shown. In some examples, system 200 may be implemented as a single or multiple IC packages. Low side supply 202, low side driver 204, and low side GaN device 206 may be examples of low side supply 102, low side driver 104, low side GaN device 106, respectively. High side supply 212, high side driver 214, and high side GaN device 216 are examples of high side supply 112, high side driver 114, and high side GaN device 116, respectively. As shown, high side supply 212 may include a capacitive element (e.g., capacitor). High side charge circuitry 210 is an example of high side charge circuitry 110 and converter elements 224 is an example of converter elements 124. For example, converter elements 224 may include an inductor. FIG. 2 is described in the context of FIG. 1 for exemplary purposes only.

As shown, high side GaN device 216 includes a control node coupled to high side driver 214, a first node coupled to positive terminal 215 of a power converter supply, and a second node coupled to one or more converter elements 224 for a power converter adapted to receive power from the power converter supply and output a regulated voltage or regulated current. In this example, low side GaN device 206 includes a control node coupled to low side driver 204, a first node coupled to one or more converter elements 224, and a second node coupled to negative terminal 217 of the power converter supply. The power converter supply may be an output of a linear regulator, power converter, power inverter, or another regulated voltage supply. For example, the power converter supply may be an output of a direct current (DC) to DC power converter, an alternating current (AC) to DC power converter, a DC to AC power inverter, or another regulated voltage supply. The power converter supply may include a battery which may be configured to store electrical energy. Examples of batteries may include, but are not limited to, nickel-cadmium, lead-acid, nickel-metal hydride, nickel-zinc, silver-oxide, lithium-ion, lithium polymer, any other type of rechargeable battery, or any combination of batteries.

Low side supply 202 includes regulated voltage supply 230 coupled in parallel with capacitor 232. Regulated voltage supply 230 may be an output of a linear regulator, power converter, power inverter, or another regulated voltage supply. For example, regulated voltage supply 230 may be an output of a direct current (DC) to DC power converter, an alternating current (AC) to DC power converter, a DC to AC power inverter, or another regulated voltage supply. Regulated voltage supply 230 may include a battery which may be configured to store electrical energy.

Low side driver 204 includes first low side switching element 234, second low side switching element 236, and low side driving circuitry 238. First low side switching element 234 includes a first node coupled to a positive terminal of low side supply 202, a second node coupled to a control node of low side GaN device 206, and a control node. Second low side switching element 236 includes a first node coupled to the control node of low side GaN device 206, a second node coupled to the negative terminal of low side supply 202, and a control node. The control node of first low side switching element 234 and/or the control node of second low side switching element 236 may be coupled to low side driving circuitry 238.

Low side driving circuitry 238 may be adapted to generate a first control signal at the control node of first low side switching element 234 to cause first low side switching element 234 to establish the first low side channel between the positive terminal of low side supply 202 and the control node of low side GaN device 206 to activate low side GaN device 206. In some example, low side driving circuitry 238 may be adapted to generate a second control signal at the control node of second low side switching element 236 to cause second low side switching element 236 to establish the second low side channel between the negative terminal of low side supply 202 and the control node of low side GaN device 206 to deactivate low side GaN device 206.

High side driver 214 includes first high side switching element 244, second high side switching element 246, and high side driving circuitry 248. First high side switching element 244 includes a first node coupled to a positive terminal of high side supply 212, a second node coupled to a control node of high side GaN device 216, and a control node. Second high side switching element 246 includes a first node coupled to the control node of high side GaN device 216, a second node coupled to the negative terminal of high side supply 212, and a control node. The control node of first high side switching element 244 and/or the control node of second high side switching element 246 may be coupled to high side driving circuitry 248.

High side driving circuitry 248 may be adapted to generate a first control signal at the control node of first high side switching element 244 to cause first high side switching element 244 to establish the first high side channel between the positive terminal of high side supply 212 and the control node of high side GaN device 216 to activate high side GaN device 216. In some example, high side driving circuitry 248 may be adapted to generate a second control signal at the control node of second high side switching element 246 to cause second high side switching element 246 to establish the second high side channel between the negative terminal of high side supply 212 and the control node of high side GaN device 216 to deactivate high side GaN device 216.

High side charge circuitry 210 includes diode 250. As shown, diode 250 includes an anode coupled low side driver 204 and a cathode coupled to high side supply 212 to prevent current from flowing from high side supply 212 to low side driver 204 and to permit current to flow from low side driver 204 to high side supply 212.

Rather than relying on specialized circuitry for regulating a voltage at high side supply 212, high side charge circuitry 210 is adapted to charge high side supply 212 with low side supply 202 when low side driver 204 activates low side GaN device 206. For example, when low side driver 204 couples a gate of low side GaN device 206 to a positive terminal of low side supply 202, diode 250 may couple low side driver 204 to the positive terminal of high side supply 212. In this example, low side GaN device 206 forms a channel that couples the negative terminal of low side supply 202 and the negative terminal of high side supply 212 such that low side supply 202 charges high side supply 212. For instance, low side GaN device 206 forms a channel that couples the negative terminal of low side supply 202 and the negative terminal of high side supply 212 such that low side supply 202 charges a capacitor of high side supply 212.

Figure 3:
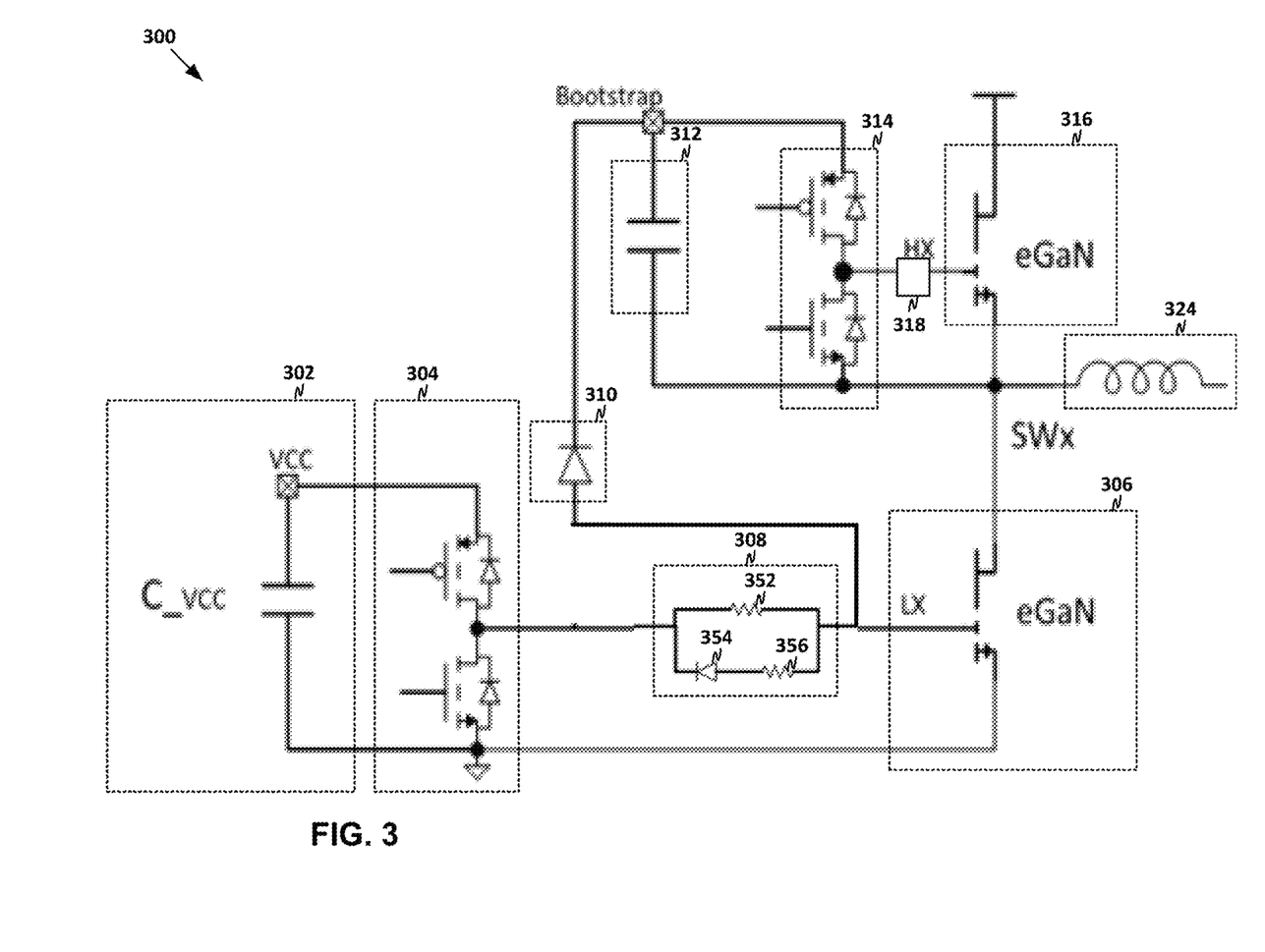
FIG. 3 is a circuit diagram illustrating a second example of the driver of FIG. 1 in accordance with one or more techniques of this disclosure.

FIG. 3 is a circuit diagram illustrating a second example of the driver of FIG. 1 in accordance with one or more techniques of this disclosure. As shown, system 300 includes low side supply 302, low side driver 304, low side GaN device 306, high side charge circuitry 310, high side supply 312, high side driver 314, high side GaN device 316, and converter elements 324, which may be substantially similar to low side supply 202, low side driver 204, low side GaN device 206, high side charge circuitry 210, high side supply 212, high side driver 214, high side GaN device 216, and converter elements 224, respectively. Moreover, system 300 further includes low side discharge circuitry 308 and high side discharge circuitry 318. System 300 may include additional components than those shown. In some examples, system 300 may be implemented as a single or multiple IC packages. FIG. 3 is described in the context of FIG. 1 for exemplary purposes only.

Low side discharge circuitry 308 is adapted to reduce current flow from low side driver 304 to low side GaN device 306 and to refrain from reducing current flow from low side GaN device 306 to low side driver 304. Low side discharge circuitry 308 may include resistor 352, diode 354, and resistor 356. As shown, a first side of low side discharge circuitry 308 is coupled to low side driver 304 and a second side of low side discharge circuitry 308 is coupled to low side GaN device 306. The first side of low side discharge circuitry 308 is coupled to a cathode of diode 354 and a first node of resistor 352. The anode of diode 354 is coupled to a first node of resistor 356. The second side of low side discharge circuitry 308 is coupled to a second node of resistor 356 and a second side of resistor 352.

High side discharge circuitry 318 may be adapted to reduce current flow from high side driver 314 to high side GaN device 316 and to refrain from reducing current flow from high side GaN device 316 to high side driver 314. High side discharge circuitry 318 may include a first resistor, a diode, and a second resistor arranged similarly to low side discharge circuitry 308.

In the example of FIG. 3, high side charge circuitry 310 is adapted to charge high side supply 312 with low side supply 302 when low side driver 304 activates low side GaN device 306. For example, when low side driver 304 couples a gate of low side GaN device 306 to a positive terminal of low side supply 302, high side charge circuitry 310 may couple the gate of low side GaN device 306 to the positive terminal of high side supply 312. In this example, low side GaN device 306 forms a channel that couples the negative terminal of low side supply 302 and the negative terminal of high side supply 312 such that low side supply 302 charges high side supply 312.

Figure 4:
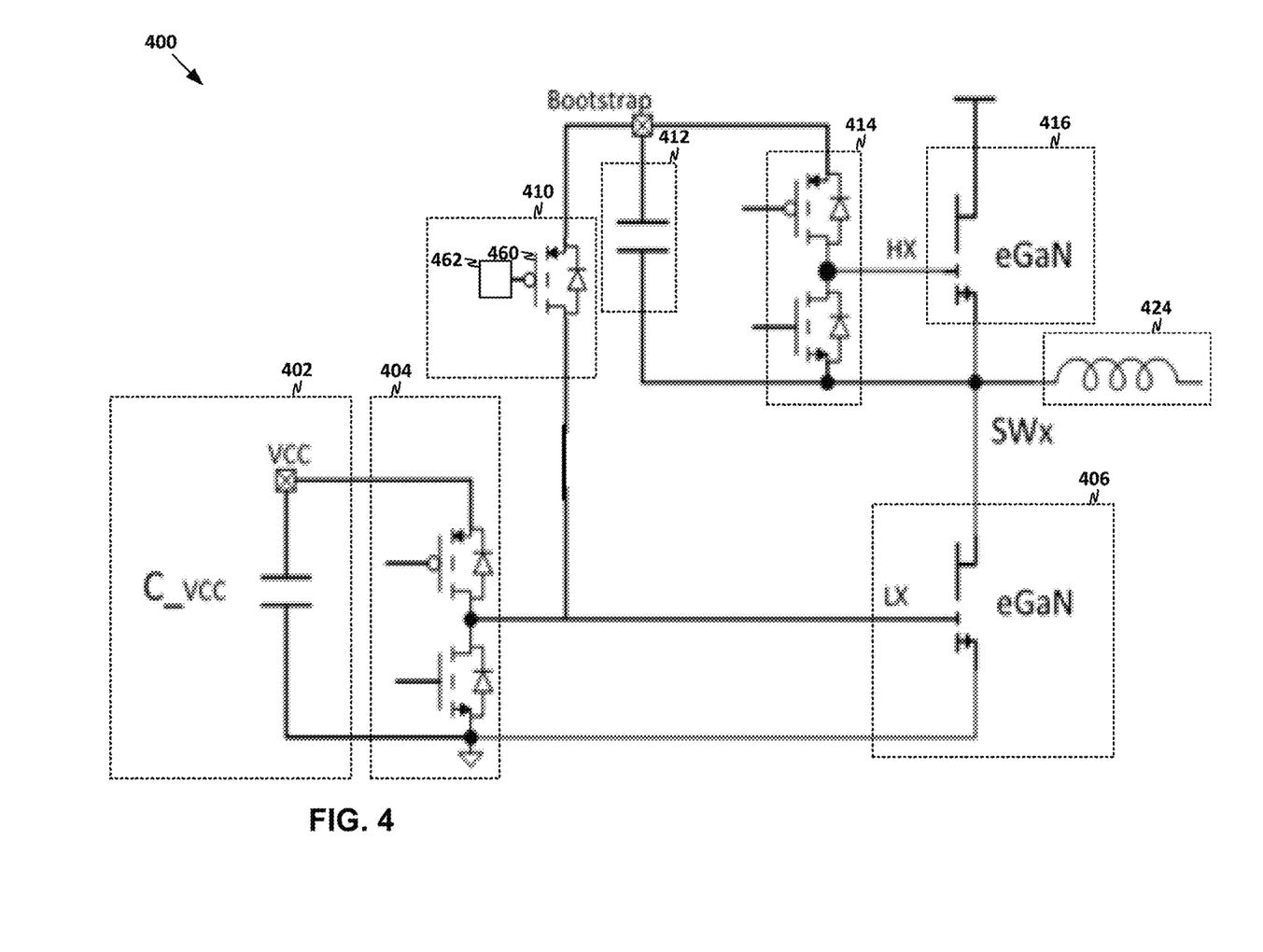
FIG. 4 is a circuit diagram illustrating a third example of the driver of FIG. 1 in accordance with one or more techniques of this disclosure.

FIG. 4 is a circuit diagram illustrating a third example of the driver of FIG. 1 in accordance with one or more techniques of this disclosure. As shown, system 400 includes low side supply 402, low side driver 404, low side GaN device 406, high side supply 412, high side driver 414, high side GaN device 416, and converter elements 424, which may be substantially similar to low side supply 202, low side driver 204, low side GaN device 206, high side supply 212, high side driver 214, high side GaN device 216, and converter elements 224, respectively. System 400 further includes high side charge circuitry 410. System 400 may include additional components than those shown. In some examples, system 400 may be implemented as a single or multiple IC packages. FIG. 4 is described in the context of FIG. 1 for exemplary purposes only.

High side charge circuitry 410 includes switching element 460 and active switching circuitry 462. Switching element 460 includes a first node coupled high side supply 412 and a second node coupled to low side driver 404 and/or low side GaN device 406. Active switching circuitry 462 may be adapted to selectively activate switching element 460 to prevent current from flowing from high side supply 412 to low side driver 404 and to permit current to flow from low side driver 404 to high side supply 412.

In the example of FIG. 4, high side charge circuitry 410 is adapted to charge high side supply 412 with low side supply 402 when low side driver 404 activates low side GaN device 406. For example, when low side driver 404 couples a gate of low side GaN device 406 to a positive terminal of low side supply 402, active switching circuitry 462 drives switching element 460 to couple the gate of low side GaN device 406 to the positive terminal of high side supply 412. In this example, low side GaN device 406 forms a channel that couples the negative terminal of low side supply 402 and the negative terminal of high side supply 412 such that low side supply 402 charges high side supply 412.

Figure 5:
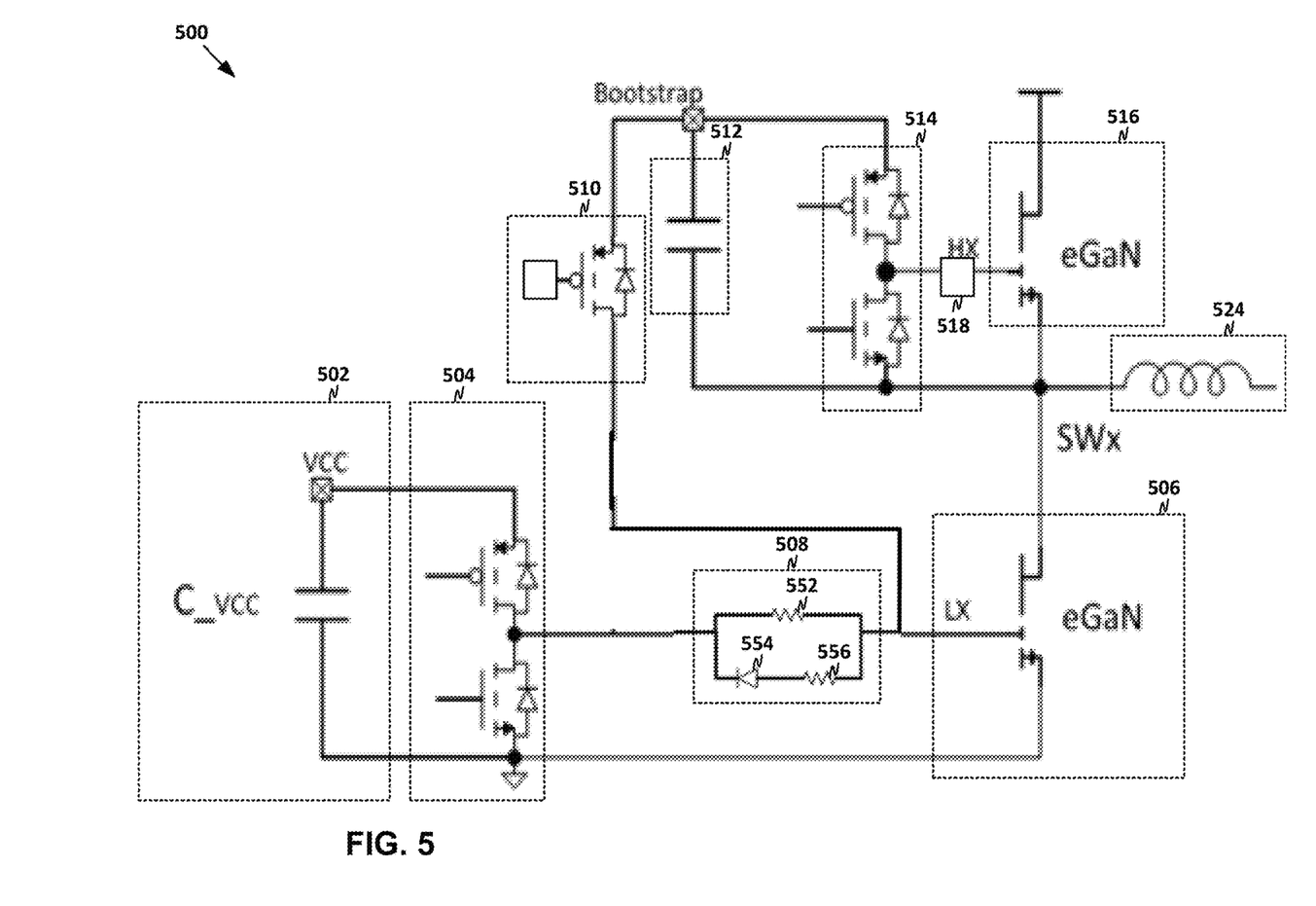
FIG. 5 is a circuit diagram illustrating a fourth example of the driver of FIG. 1 in accordance with one or more techniques of this disclosure.

FIG. 5 is a circuit diagram illustrating a fourth example of the driver of FIG. 1 in accordance with one or more techniques of this disclosure. As shown, system 500 includes low side supply 502, low side driver 504, low side GaN device 506, high side charge circuitry 510, high side supply 512, high side driver 514, high side GaN device 516, and converter elements 524, which may be substantially similar to low side supply 402, low side driver 404, low side GaN device 406, high side charge circuitry 410, high side supply 412, high side driver 414, high side GaN device 416, and converter elements 424, respectively. Moreover, system 500 further includes low side discharge circuitry 508 and high side discharge circuitry 518. System 500 may include additional components than those shown. In some examples, system 500 may be implemented as a single or multiple IC packages. FIG. 5 is described in the context of FIGS. 1 and 4 for exemplary purposes only.

Low side discharge circuitry 508 is adapted to reduce current flow from low side driver 504 to low side GaN device 506 and to refrain from reducing current flow from low side GaN device 506 to low side driver 504. Low side discharge circuitry 508 may include resistor 552, diode 554, and resistor 556. As shown, a first side of low side discharge circuitry 508 is coupled to low side driver 504 and a second side of low side discharge circuitry 508 is coupled to low side GaN device 506. The first side of low side discharge circuitry 508 is coupled to a cathode of diode 554 and a first node of resistor 552. The anode of diode 554 is coupled to a first node of resistor 556. The second side of low side discharge circuitry 508 is coupled to a second node of resistor 556 and a second side of resistor 552.

High side discharge circuitry 518 may be adapted to reduce current flow from high side driver 514 to high side GaN device 516 and to refrain from reducing current flow from high side GaN device 516 to high side driver 514. High side discharge circuitry 518 may include a first resistor, a diode, and a second resistor arranged similarly to low side discharge circuitry 508.

In the example of FIG. 5, high side charge circuitry 510 is adapted to charge high side supply 512 with low side supply 502 when low side driver 504 activates low side GaN device 506. For example, when low side driver 504 couples a gate of low side GaN device 506 to a positive terminal of low side supply 502, high side charge circuitry 510 may couple the gate of low side GaN device 506 to the positive terminal of high side supply 512. In this example, low side GaN device 506 forms a channel that couples the negative terminal of low side supply 502 and the negative terminal of high side supply 512 such that low side supply 502 charges high side supply 512.

Figure 6:
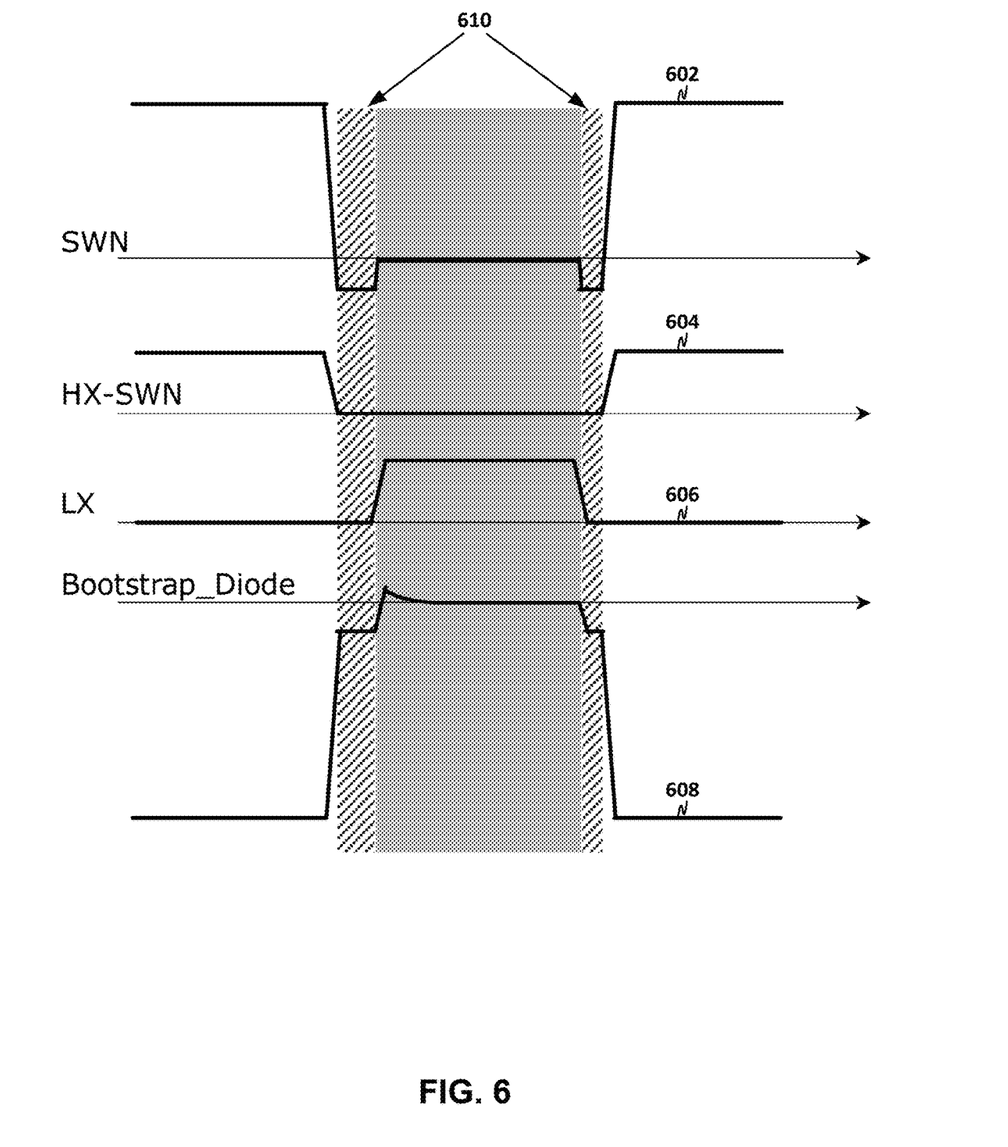
FIG. 6 is a first illustration of a performance of the driver of FIG. 1 in accordance with one or more techniques of this disclosure.

FIG. 6 is a first illustration of a performance of the driver of FIG. 1 in accordance with one or more techniques of this disclosure. The abscissa axis (e.g., horizontal) of FIG. 6 represents time and the ordinate axis (e.g., vertical) of FIG. 6 represents a converter voltage (SWN) 602 at an input to converter elements 124, a high side switching voltage (HX-SWN) 604 at a gate of high side GaN device 116, a low side switching voltage (LX) 606 at a gate of low side GaN device 106, and a bootstrap voltage 608 (Bootstrap_Diode) at high side charge circuitry 110.

As shown, converter voltage 602 is negative during dead-times 610, for example, due to free-wheeling inductor current flow. However, bootstrap voltage 608 illustrates that high side charge circuitry 110 blocks a charging of high side supply 112 during dead-times 610. In this way, high side charge circuitry 110 may avoid overcharging of high side supply 112 in a presence of low side free-wheeling inductor current flow.

Figure 7:
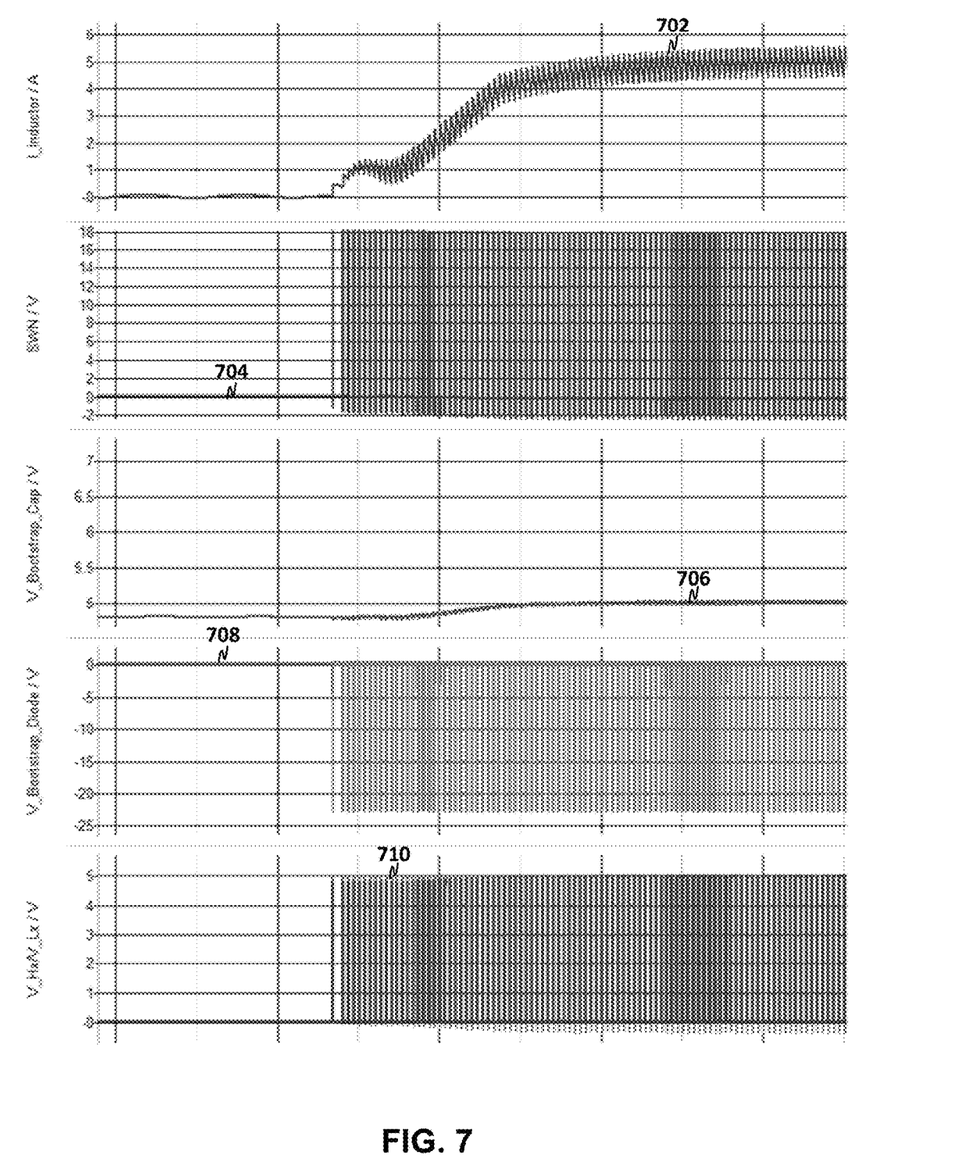
FIG. 7 is a second illustration of a performance of the driver of FIG. 1 in accordance with one or more techniques of this disclosure.

FIG. 7 is a second illustration of a performance of the driver of FIG. 1 in accordance with one or more techniques of this disclosure. The abscissa axis (e.g., horizontal) of FIG. 7 represents time and the ordinate axis (e.g., vertical) of FIG. 7 represents an inductor current 702 at converter elements 124, converter voltage 704 at an input to converter elements 124, a high side supply voltage 706 at high side supply 112, a bootstrap voltage 708 at high side charge circuitry 110, and gate-to-source voltage 710 at high side GaN device 116. As shown, high side supply voltage 706 remains less than a maximum GaN voltage rating of 5 volts, thereby resulting in gate-to-source voltage 710 being less than the maximum GaN voltage rating. As such, techniques described here may prevent an overcharge of high side supply 112 above the maximum rating of GaN Voltage Source to Gate "$V_{GS}$".

Figure 8:
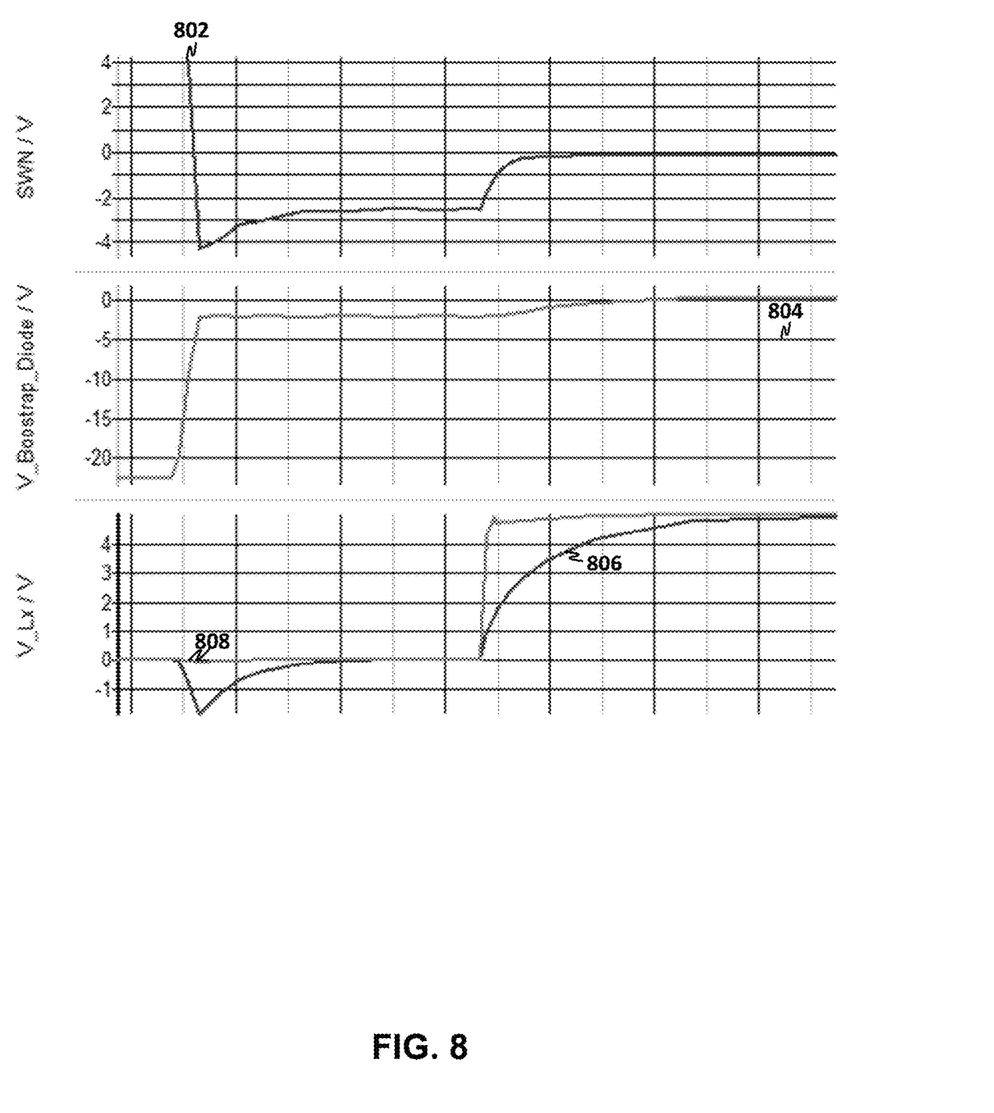
FIG. 8 is a third illustration of a performance of the driver of FIG. 1 in accordance with one or more techniques of this disclosure.

FIG. 8 is a third illustration of a performance of the driver of FIG. 1 in accordance with one or more techniques of this disclosure. The abscissa axis (e.g., horizontal) of FIG. 8 represents time and the ordinate axis (e.g., vertical) of FIG. 8 represents converter voltage 802 at an input to converter elements 124, a bootstrap voltage 804 at high side charge circuitry 110, a low side switching voltage 806 at a gate of low side GaN device 106, and a low side driving voltage 808 output by low side driver 104. As shown, when first low side switching element 234 (e.g., a pull-up pMOS) is OFF (e.g., deactivated) the body diode of first low side switching element 234 blocks the charge path from low side supply 102 (e.g., VCC). When first low side switching element 234 (e.g., a pull-up pMOS) ON (e.g., activated) the charge path is active, but converter voltage 802 is not dangerous because low side GaN device 106 is turned ON (e.g., activated). In this way, system 100 may help to achieve a desired timing between low side turn-on of low side GaN device 106 and the bootstrap cap recharge path activation, even in a presence of additional external components on the gate driving path.

Figure 9:
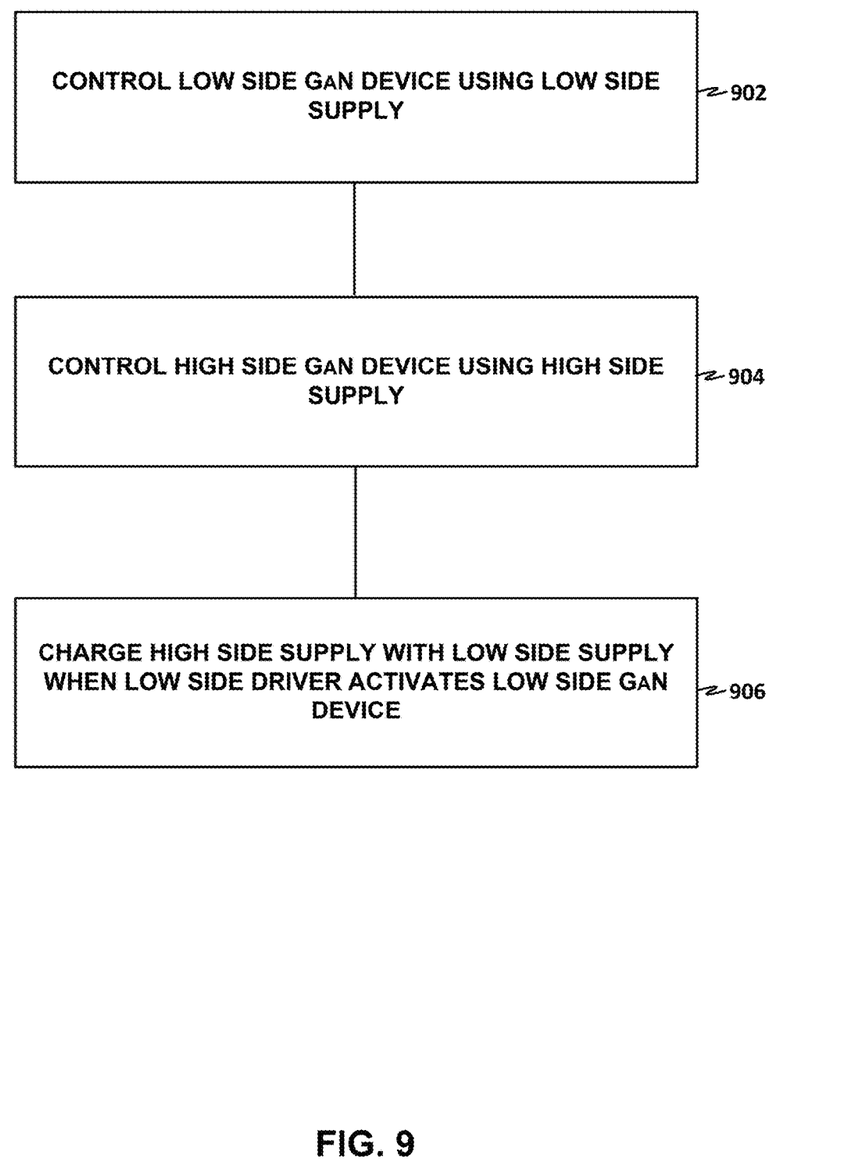
FIG. 9 is a flow diagram for a method for driving GaN devices in accordance with one or more techniques of this disclosure.

FIG. 9 is a flow diagram for a method for driving GaN devices in accordance with one or more techniques of this disclosure. FIG. 9 is described in the context of FIGS. 1-8 for exemplary purposes only. In operation, low side driver 104 controls low side GaN device 106 using low side supply 102 (902). High side driver 114 control high side GaN device 116 using high side supply 112 (904). High side charge circuitry 110 charges high side supply 112 with low side supply 102 when low side driver 104 activates low side GaN device 106 (906).

While a device has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

The following examples may illustrate one or more aspects of the disclosure.

Example 1

A device for switching Gallium Nitride (GaN) devices, the device comprising: a high side driver adapted to control a high side GaN device using a high side supply; a low side driver adapted to control a low side GaN device using a low side supply; and high side charge circuitry adapted to charge the high side supply with the low side supply when the low side driver activates the low side GaN device.

Example 2

The device of example 1, wherein the high side charge circuitry is adapted to prevent current from flowing from the high side supply to the low side driver and to permit current to flow from the low side driver to the high side supply.

Example 3

The device of any combination of examples 1-2, wherein the high side charge circuitry comprises a diode comprising an anode coupled the low side driver and a cathode coupled to the high side supply to prevent current from flowing from the high side supply to the low side driver and to permit current to flow from the low side driver to the high side supply.

Example 4

The device of any combination of examples 1-3, wherein the high side charge circuitry comprises: a switching element comprising a first node coupled the high side supply and a second node coupled to the low side driver; and active switching circuitry adapted to selectively activate the switching element to prevent current from flowing from the high side supply to the low side driver and to permit current to flow from the low side driver to the high side supply.

Example 5

The device of any combination of examples 1-4, wherein the low side supply comprises a capacitor coupled in parallel with a voltage source; and wherein the high side supply comprises a capacitor.

Example 6

The device of any combination of examples 1-5, comprising one or more of: low side discharge circuitry adapted to reduce current flow from the low side driver to the low side GaN device and to refrain from reducing current flow from the low side GaN device to the low side driver; or high side discharge circuitry adapted to reduce current flow from the high side driver to the high side GaN device and to refrain from reducing current flow from the high side GaN device to the high side driver.

Example 7

The device of any combination of examples 1-6, wherein the low side driver is adapted to establish a first low side channel between a positive terminal of the low side supply and the low side GaN device to activate the low side GaN device and to establish a second low side channel between a negative terminal of the low side supply and the low side GaN device to deactivate the low side GaN device; and wherein the high side driver is adapted to establish a first high side channel between a positive terminal of the high side supply and the high side GaN device to activate the high side GaN device and to establish a second high side channel between a negative terminal of the high side supply and the low side GaN device to deactivate the high side GaN device.

Example 8

The device of any combination of examples 1-7, wherein the low side driver comprises: a first low side switching element comprising a first node coupled to the positive terminal of the low side supply, a second node coupled to the low side GaN device, and a control node; a second low side switching element comprising a first node coupled to the low side GaN device, a second node coupled to the negative terminal of the low side supply, and a control node; and low side driving circuitry adapted to generate a first control signal at the control node of the first low side switching element to cause the first low side switching element to establish the first low side channel between the positive terminal of the low side supply and the low side GaN device to activate the low side GaN device and to generate a second control signal at the control node of the second low side switching element to cause the second low side switching element to establish the second low side channel between the negative terminal of the low side supply and the low side GaN device to deactivate the low side GaN device.

Example 9

The device of any combination of examples 1-8, wherein the high side driver comprises: a first high side switching element comprising a first node coupled to the positive terminal of the high side supply, a second node coupled to the high side GaN device, and a control node; a second high side switching element comprising a first node coupled to the high side GaN device, a second node coupled to the negative terminal of the high side supply, and a control node; and high side driving circuitry adapted to generate a first control signal at the control node of the first high side switching element to cause the first high side switching element to establish the first high side channel between the positive terminal of the high side supply and the high side GaN device to activate the high side GaN device and to generate a second control signal at the control node of the second high side switching element to cause the second high side switching element to establish the second high side channel between the negative terminal of the high side supply and the high side GaN device to deactivate the high side GaN device.

Example 10

The device of any combination of examples 1-9, wherein the high side GaN device comprises a control node coupled to the high side driver, a first node coupled to a positive terminal of a power converter supply, and a second node coupled to one or more converter elements for a power converter adapted to receive power from the power converter supply and output a regulated voltage or regulated current; and wherein the low side GaN device comprises a control node coupled to the low side driver, a first node coupled to the one or more converter elements, and a second node coupled to a negative terminal of the power converter supply.

Example 11

A method for driving a Gallium Nitride (GaN) devices, the method comprising: controlling a high side GaN device using a high side supply; controlling a low side GaN device using a low side supply; and charging the high side supply with the low side supply when the low side driver activates the low side GaN device.

Example 12

The method of example 11, wherein charging the high side supply comprises: preventing current from flowing from the high side supply to the low side driver; and permitting current to flow from the low side driver to the high side supply.

Example 13

The method of any combination of examples 11-12, wherein charging the high side voltage comprises: selectively activating a switching element to prevent current from flowing from the high side supply to the low side driver and to permit current to flow from the low side driver to the high side supply.

Example 14

The device of any combination of examples 11-13, wherein the low side supply comprises a capacitor coupled in parallel with a voltage source; and wherein the high side supply comprises a capacitor.

Example 15

The method of any combination of examples 11-14, wherein controlling the high side GaN device comprises reducing current flow from the high side driver to the high side GaN device and refraining from reducing current flow from the high side GaN device to the high side driver; and wherein controlling the low side GaN device comprises reducing current flow from the low side driver to the low side GaN device and refraining from reducing current flow from the low side GaN device to the low side driver.

Example 16

The method of any combination of examples 11-15, wherein controlling the low side GaN device comprises establishing a first low side channel between a positive terminal of the low side supply and the low side GaN device to activate the low side GaN device and establishing a second low side channel between a negative terminal of the low side supply and the low side GaN device to deactivate the low side GaN device; and wherein controlling the high side GaN device comprises establishing a first high side channel between a positive terminal of the high side supply and the high side GaN device to activate the high side GaN device and establishing a second high side channel between a negative terminal of the high side supply and the high side GaN device to deactivate the high side GaN device.

Example 17

The method of any combination of examples 11-16, wherein controlling the low side GaN device comprises: generating a control signal at a control node of a first low side switching element to cause the first low side switching element to establish the first low side channel between the positive terminal of the low side supply and the low side GaN device to activate the low side GaN device; and generating a second control signal at a control node of a second low side switching element to cause the second low side switching element to establish the second low side channel between the negative terminal of the low side supply and the low side GaN device to deactivate the low side GaN device.

Example 18

The method of any combination of examples 11-17, wherein controlling the high side GaN device comprises: generating a first control signal at a control node of a first high side switching element to cause the first high side switching element to establish the first high side channel between the positive terminal of the high side supply and the high side GaN device to activate the high side GaN device; and generating a second control signal at a control node of a second high side switching element to cause the second high side switching element to establish the second high side channel between the negative terminal of the high side supply and the high side GaN device to deactivate the high side GaN device.

Example 19

The method of any combination of examples 11-18, wherein the high side GaN device comprises a control node coupled to the high side driver, a first node coupled to a positive terminal of a power converter supply, and a second node coupled to one or more converter elements for a power converter adapted to receive power from the power converter supply and output a regulated voltage or regulated current; and wherein the low side GaN device comprises a control node coupled to the low side driver, a first node coupled to the one or more converter elements, and a second node coupled to a negative terminal of the power converter supply.

Example 20

A system for controlling a power converter, the system comprising: a high side GaN device; a low side GaN device; a high side driver adapted to control the high side GaN device using a high side supply; a low side driver adapted to control the low side GaN device using a low side supply; and high side charge circuitry adapted to charge the high side supply with the low side supply when the low side driver activates the low side GaN device.

Various aspects have been described in this disclosure. These and other aspects are within the scope of the following claims.

The invention claimed is:
1. A device for switching Gallium Nitride (GaN) devices, the device comprising: a high side driver adapted to control a high side GaN device using a high side supply, wherein the high side supply comprises a first capacitor; a low side driver adapted to control a low side GaN device using a low side supply, wherein the low side supply comprises a second capacitor coupled in parallel with a voltage source; and high side charge circuitry adapted to charge the high side supply with the low side supply when the low side driver activates the low side GaN device, wherein, to charge the high side supply, the high side charge circuitry is adapted to couple a gate of the low side GaN device to the first capacitor of the high side supply such that the low side supply charges the first capacitor of the high side supply when the low side driver activates the low side GaN device.

2. The device of claim 1, wherein the high side charge circuitry is adapted to prevent current from flowing from the high side supply to the low side driver and to permit current to flow from the low side driver to the high side supply.

3. The device of claim 2, wherein the high side charge circuitry comprises a diode comprising an anode coupled the low side driver and a cathode coupled to the high side supply to prevent current from flowing from the high side supply to the low side driver and to permit current to flow from the low side driver to the high side supply.

4. The device of claim 2, wherein the high side charge circuitry comprises:
a switching element comprising a first node coupled the high side supply and a second node coupled to the low side driver; and
active switching circuitry adapted to selectively activate the switching element to prevent current from flowing from the high side supply to the low side driver and to permit current to flow from the low side driver to the high side supply.

5. The device of claim 1, comprising one or more of:
low side discharge circuitry adapted to reduce current flow from the low side driver to the low side GaN device and to refrain from reducing current flow from the low side GaN device to the low side driver; or
high side discharge circuitry adapted to reduce current flow from the high side driver to the high side GaN device and to refrain from reducing current flow from the high side GaN device to the high side driver.

6. The device of claim 1,
wherein the low side driver is adapted to establish a first low side channel between a positive terminal of the low side supply and the low side GaN device to activate the low side GaN device and to establish a second low side channel between a negative terminal of the low side supply and the low side GaN device to deactivate the low side GaN device; and
wherein the high side driver is adapted to establish a first high side channel between a positive terminal of the high side supply and the high side GaN device to activate the high side GaN device and to establish a second high side channel between a negative terminal of the high side supply and the low side GaN device to deactivate the high side GaN device.

7. The device of claim 6, wherein the low side driver comprises:
a first low side switching element comprising a first node coupled to the positive terminal of the low side supply, a second node coupled to the low side GaN device, and a control node;
a second low side switching element comprising a first node coupled to the low side GaN device, a second node coupled to the negative terminal of the low side supply, and a control node; and
low side driving circuitry adapted to generate a first control signal at the control node of the first low side switching element to cause the first low side switching element to establish the first low side channel between the positive terminal of the low side supply and the low side GaN device to activate the low side GaN device and to generate a second control signal at the control node of the second low side switching element to cause the second low side switching element to establish the second low side channel between the negative terminal of the low side supply and the low side GaN device to deactivate the low side GaN device.

8. The device of claim 6, wherein the high side driver comprises:
a first high side switching element comprising a first node coupled to the positive terminal of the high side supply, a second node coupled to the high side GaN device, and a control node;
a second high side switching element comprising a first node coupled to the high side GaN device, a second node coupled to the negative terminal of the high side supply, and a control node; and
high side driving circuitry adapted to generate a first control signal at the control node of the first high side switching element to cause the first high side switching element to establish the first high side channel between the positive terminal of the high side supply and the high side GaN device to activate the high side GaN device and to generate a second control signal at the control node of the second high side switching element to cause the second high side switching element to establish the second high side channel between the negative terminal of the high side supply and the high side GaN device to deactivate the high side GaN device.

9. The device of claim 1,
wherein the high side GaN device comprises a control node coupled to the high side driver, a first node coupled to a positive terminal of a power converter supply, and a second node coupled to one or more converter elements for a power converter adapted to receive power from the power converter supply and output a regulated voltage or regulated current; and
wherein the low side GaN device comprises a control node coupled to the low side driver, a first node coupled to the one or more converter elements, and a second node coupled to a negative terminal of the power converter supply.

10. A method for driving a Gallium Nitride (GaN) devices, the method comprising: controlling a high side GaN device using a high side supply, wherein the high side supply comprises a first capacitor; controlling a low side GaN device using a low side supply, wherein the low side supply comprises a second capacitor coupled in parallel with a voltage source; and charging the high side supply with the low side supply when the low side driver activates the low side GaN device, wherein charging the high side supply comprises coupling a gate of the low side GaN device to the first capacitor of the high side supply such that the low side supply charges the first capacitor of the high side supply when the low side driver activates the low side GaN device.

11. The method of claim 10, wherein charging the high side supply comprises:
preventing current from flowing from the high side supply to the low side driver; and
permitting current to flow from the low side driver to the high side supply.

12. The method of claim 11, wherein charging the high side voltage comprises:
selectively activating a switching element to prevent current from flowing from the high side supply to the low side driver and to permit current to flow from the low side driver to the high side supply.

13. The method of claim 10,
wherein controlling the high side GaN device comprises reducing current flow from the high side driver to the high side GaN device and refraining from reducing current flow from the high side GaN device to the high side driver; and
wherein controlling the low side GaN device comprises reducing current flow from the low side driver to the low side GaN device and refraining from reducing current flow from the low side GaN device to the low side driver.

14. The method of claim 10,
wherein controlling the low side GaN device comprises establishing a first low side channel between a positive terminal of the low side supply and the low side GaN device to activate the low side GaN device and establishing a second low side channel between a negative terminal of the low side supply and the low side GaN device to deactivate the low side GaN device; and
wherein controlling the high side GaN device comprises establishing a first high side channel between a positive terminal of the high side supply and the high side GaN device to activate the high side GaN device and establishing a second high side channel between a negative terminal of the high side supply and the high side GaN device to deactivate the high side GaN device.

15. The method of claim 14, wherein controlling the low side GaN device comprises:
generating a control signal at a control node of a first low side switching element to cause the first low side switching element to establish the first low side channel between the positive terminal of the low side supply and the low side GaN device to activate the low side GaN device; and
generating a second control signal at a control node of a second low side switching element to cause the second low side switching element to establish the second low side channel between the negative terminal of the low side supply and the low side GaN device to deactivate the low side GaN device.

16. The method of claim 14, wherein controlling the high side GaN device comprises:
generating a first control signal at a control node of a first high side switching element to cause the first high side switching element to establish the first high side channel between the positive terminal of the high side supply and the high side GaN device to activate the high side GaN device; and
generating a second control signal at a control node of a second high side switching element to cause the second high side switching element to establish the second high side channel between the negative terminal of the high side supply and the high side GaN device to deactivate the high side GaN device.

17. The method of claim 10,
wherein the high side GaN device comprises a control node coupled to the high side driver, a first node coupled to a positive terminal of a power converter supply, and a second node coupled to one or more converter elements for a power converter adapted to receive power from the power converter supply and output a regulated voltage or regulated current; and
wherein the low side GaN device comprises a control node coupled to the low side driver, a first node coupled to the one or more converter elements, and a second node coupled to a negative terminal of the power converter supply.

18. A system for controlling a power converter, the system comprising: a high side GaN device; a low side GaN device; a high side driver adapted to control the high side GaN device using a high side supply, wherein the high side supply comprises a first capacitor; a low side driver adapted to control the low side GaN device using a low side supply, wherein the low side supply comprises a second capacitor coupled in parallel with a voltage source; and high side charge circuitry adapted to charge the high side supply with the low side supply when the low side driver activates the low side GaN device, wherein, to charge the high side supply, the high side charge circuitry is adapted to couple a gate of the low side GaN device to the first capacitor of the high side supply such that the low side supply charges the first capacitor of the high side supply when the low side driver activates the low side GaN device.

* * * * *